(12) United States Patent
Terakawa et al.

(10) Patent No.: US 7,164,150 B2
(45) Date of Patent: Jan. 16, 2007

(54) PHOTOVOLTAIC DEVICE AND MANUFACTURING METHOD THEREOF

(75) Inventors: Akira Terakawa, Nara (JP); Toshio Asaumi, Kobe (JP)

(73) Assignee: Sanyo Electric Co., Ltd., Osaka (JP)

( * ) Notice: Subject to any disclaimer, the term of this patent is extended or adjusted under 35 U.S.C. 154(b) by 5 days.

(21) Appl. No.: 10/378,609

(22) Filed: Mar. 5, 2003

(65) Prior Publication Data
US 2003/0168660 A1    Sep. 11, 2003

(30) Foreign Application Priority Data
Mar. 5, 2002  (JP) .............................. 2002/059393

(51) Int. Cl.
*H01L 29/04*  (2006.01)
*H01L 31/20*  (2006.01)
(52) U.S. Cl. ......................................... 257/52; 257/55
(58) Field of Classification Search ............ 257/52–56, 257/62–63, 65, 184
See application file for complete search history.

(56) References Cited

U.S. PATENT DOCUMENTS 5,213,628 A    5/1993  Noguchi et al. ............ 136/255
5,705,828 A *  1/1998  Noguchi et al. ............... 257/53
5,716,480 A *  2/1998  Matsuyama et al. ......... 136/249

FOREIGN PATENT DOCUMENTS

JP          4-130671         5/1992

OTHER PUBLICATIONS

Isomura, Masao et al., "Boron-compensation effect on hydrogenated amorphous silicon with oxygen and nitrogen impurities", *Appl. Phys. Lett.*, vol. 68 (9), Feb. 26, 1996.

* cited by examiner

*Primary Examiner*—Theresa T. Doan
(74) *Attorney, Agent, or Firm*—Westerman, Hattori, Daniels & Adrian, LLP.

(57) ABSTRACT

In a photovoltaic device of the present invention, junction characteristics are improved by enhancing interface characteristics between a crystalline silicon semiconductor and an amorphous silicon semiconductor. In the photovoltaic device, an n-type crystalline substrate (11) and a p-type amorphous silicon thin film (13) are laminated with an i-type amorphous silicon thin film (12) interposed as well as an n-type amorphous silicon thin film (15) is provided on a rear surface of the crystalline silicon substrate (11) by interposing an i-type amorphous silicon thin film (14) between them. Oxygen atoms exist at interfaces between the crystalline silicon substrate (11) and the i-type amorphous silicon thin films (12), (14) in a higher concentration than that in the i-type amorphous silicon thin films (12), (14).

2 Claims, 4 Drawing Sheets

PHOTOVOLTAIC DEVICE AND MANUFACTURING METHOD THEREOF

BACKGROUND OF THE INVENTION

1. Field of the Invention

This invention relates to a photovoltaic device and a manufacturing method of the photovoltaic device.

2. Description of Prior Art

Photovoltaic devices are broadly categorized into single crystalline-, polycrystalline-, and amorphous-based type depending on a type of a semiconductor of a part for converting absorbed light into electric current. By taking advantage of features of the amorphous semiconductor thin film and crystalline semiconductor, a hybrid photovoltaic device with both types of semiconductor laminated has been researched. For example, U.S. Pat. No. 5,213,628 discloses a photovoltaic device of this kind. In this photovoltaic device, a substantially intrinsic amorphous silicon thin film is placed at a junction interface in forming semiconductor junction by combining a crystalline silicon semiconductor and an amorphous silicon semiconductor having different conductivity from each other so as to improve interface characteristics and photovoltaic conversion characteristics.

FIG. 5 is a perspective view of a photovoltaic device having a structure of which a substantially intrinsic (i-type) amorphous semiconductor layer is placed at a junction interface between an amorphous semiconductor and a single crystalline silicon semiconductor whose surface is textured. In this specification, the substantially intrinsic amorphous semiconductor includes both of an intrinsic amorphous semiconductor formed without the introduction of dopant and a substantially intrinsic amorphous semiconductor doped with a small number of atoms belonging to group 3B of the periodic table such as boron.

As shown in the FIG. 5, surfaces of an n-type single crystalline silicon (Si) substrate 101 are textured by alkaline etching or the like. An i-type amorphous silicon (a-Si) semiconductor layer 102, a p-type amorphous silicon (a-Si) semiconductor layer 103 and a transparent electrode 104 composed of a transparent conductive film such as an ITO (Indium Tin Oxide) film are laminated in this order on the textured surface on a light receiving side of the single crystalline silicon substrate 101. Additionally, comb-shaped collector electrodes 105 of silver (Ag) for example are formed on the transparent electrode 104.

An i-type amorphous silicon (a-Si) semiconductor layer 106, an n-type amorphous silicon (a-Si) semiconductor layer 107 and a transparent electrode 108 composed of a transparent conductive film such as an ITO film are laminated in this order on a rear surface of the single crystalline silicon substrate 101 to achieve BSF (Back Surface Field) effect. Additionally, comb-shaped collector electrodes 109 of silver (Ag) for example are formed on the transparent electrode 108.

With above structure, light reflection is suppressed by the textured surface so that light can be taken into the device effectively.

As can be appreciated, the characteristics of the interface between the single crystalline silicon substrate and the amorphous silicon thin film are improved by interposing the substantially intrinsic amorphous silicon thin film without dopant or with trace amounts of boron doped when the crystalline silicon substrate and the amorphous silicon thin film having different conductivity from each other are combined to form a p-n junction. The p-n junction of this structure can be formed at a temperature of not higher than 200° C. that is relatively low temperature in junction forming. Therefore, excellent junction characteristics can be obtained even with an impure substrate, which is subject to an adverse effect of impurity or deficiency of oxygen induction under a high temperature process.

The p-n junction formed at a temperature of 200° C. or lower has excellent junction characteristics. However, even the excellent junction characteristics has some room for improvement.

SUMMARY OF THE INVENTION

The present invention was made to solve the above mentioned problem and has objectives to improve interface characteristics and a junction characteristics between a crystalline semiconductor and an amorphous semiconductor thin film.

A photovoltaic device of the present invention comprises a crystalline semiconductor with impurity doped to establish one conductivity type, a substantially intrinsic amorphous semiconductor thin film formed on the crystalline semiconductor having one conductivity type and an amorphous semiconductor thin film with impurity doped to establish the same or another conductivity type formed on the substantially intrinsic amorphous semiconductor thin film. Atoms, which reduce the average coordination number in the substantially intrinsic amorphous semiconductor thin film, exist in the interface formed with the crystalline semiconductor and the substantially intrinsic amorphous semiconductor thin film in a higher concentration than in a bulk.

In this invention, the substantially intrinsic amorphous semiconductor includes both of an intrinsic amorphous semiconductor formed without the introduction of dopant and a substantially intrinsic amorphous semiconductor doped with a small number of atoms belonging to group 3B of the periodic table such as boron. The amorphous semiconductor thin film includes not only a perfect amorphous semiconductor thin film but also an amorphous semiconductor thin film having minute crystal grains.

In this invention, the crystalline semiconductor is a crystalline silicon and the amorphous semiconductor thin film is an amorphous silicon thin film. Atoms, which reduce the average coordination number, are selectable among atoms belonging to group 6B of the periodic table.

According to the above mentioned structure, a network formed by covalent bonds of silicon atoms having a coordination number of four increases flexibility of the network structure by lacing atoms having a coordination number of two and belonging to group 6B of the periodic table. Therefore carrier recombination is suppressed while a defect density at the interface is reduced. As a result, open circuit voltage (Voc) and fill factor (F.F.) are improved.

The crystalline silicon semiconductor with impurity doped to establish one conductivity type is an n-type crystalline silicon semiconductor, and the amorphous silicon semiconductor thin film with impurity doped to establish another conductivity type is a p-type amorphous silicon semiconductor thin film.

As an atom for reducing the average coordination number, oxygen may be used. A volume concentration of oxygen in the substantially intrinsic amorphous silicon semiconductor thin film is higher than that in the crystalline silicon semiconductor but $2 \times 10^{22}$ cm$^{-3}$ and lower. A surface density of oxygen atoms at the interface is in a range between $5 \times 10^{13}$ cm$^{-2}$ and $1 \times 10^{16}$ cm$^{-2}$.

A photovoltaic device of the present invention comprises a crystalline semiconductor with impurity doped to establish one conductivity type, a substantially intrinsic amorphous semiconductor thin film formed on a front surface of the crystalline semiconductor having one conductivity type, an amorphous semiconductor thin film with impurity doped to establish another conductivity type formed on the substantially intrinsic amorphous semiconductor thin film, a substantially intrinsic amorphous semiconductor thin film formed on a rear surface of the crystalline semiconductor having one conductivity type and an amorphous semiconductor thin film with impurity doped to establish another conductivity type formed on the substantially intrinsic amorphous semiconductor thin film. Atoms, which reduce the average coordination number in the substantially intrinsic amorphous semiconductor thin film, exist in the interface formed with the crystalline semiconductor and the substantially intrinsic amorphous semiconductor thin film on the rear surface side in a higher concentrarion than in a bulk.

In this invention, the crystalline semiconductor is a crystalline silicon and the amorphous semiconductor thin film is an amorphous silicon thin film. Atoms, which reduce the average coordination number, are selectable among atoms belonging to group 6B of the periodic table.

According to the above mentioned structure, a network formed by covalent bonds of silicon atoms having a coordination number of four increases flexibility of the network structure by lacing atoms having a coordination number of two and belonging to group 6B of the periodic table. Therefore a defect density at the interface is reduced.

The crystalline silicon semiconductor with impurity doped to establish one conductivity type is an n-type crystalline silicon semiconductor, and the amorphous silicon semiconductor thin film with impurity doped to establish the same conductivity type is an n-type amorphous silicon semiconductor thin film.

As an atom for reducing the average coordination number, oxygen may be used. A volume concentration of oxygen in the substantially intrinsic amorphous silicon semiconductor thin film on the rear surface side is higher than that in the crystalline silicon semiconductor but $2 \times 10^{22}$ cm$^{-3}$ and lower. A surface density of oxygen atoms at the interface is in a range between $5 \times 10^{13}$ cm$^{-2}$ and $5 \times 10^{16}$ cm$^{-2}$.

Atoms, which reduce the average coordination number in the substantially intrinsic amorphous semiconductor thin film, exist in the interface formed with the crystalline semiconductor and the substantially intrinsic amorphous semiconductor thin film on the front surface side in a higher concentration than in a bulk.

Furthermore a manufacturing method of the photovoltaic device of the present invention comprises interposing a substantially intrinsic amorphous silicon thin film between a crystalline silicon semiconductor with impurity doped to establish one conductivity type and an amorphous silicon semiconductor thin film with impurity doped to establish another conductivity type and interposing a substantially intrinsic amorphous silicon film between a rear surface of the crystalline semiconductor and an amorphous silicon thin film with impurity doped to establish the same conductivity type as the crystalline semiconductor. The substantially intrinsic amorphous silicon thin film without dopant is formed on the surfaces of the crystalline silicon semiconductor on which plasma process was performed by generating plasma discharge with the use of a gas mixture of hydrogen gas and carbon gas.

According to the above mentioned structure, oxygen atoms can exist at the interface between the crystalline silicon semiconductor and the substantially intrinsic amorphous silicon thin film.

The foregoing and other objects, features, aspects and advantages of the present invention will become more apparent from the following detailed description of the present invention when reviewed in conjunction with the accompanying drawings.

DESCRIPTION OF PREFERRED EMBODIMENTS

Following is a description on an embodiment of this invention with reference to drawings. FIGS. 1A to 1D are cross sectional views showing a photovoltaic device in each manufacturing process of the embodiment according to the invention.

A single crystalline silicon substrate, a polycrystalline silicon substrate or the like are used as a crystalline semiconductor substrate. In this embodiment, a single crystalline substrate 11 of resistivity not more than 5 Ωcm and 300 μm in thickness is employed. Both front and rear surfaces of this single crystalline silicon substrate 11 are textured by anisotropic etching using alkaline solution such as sodium hydroxide solution or potassium hydroxide solution.

Figure 1A:
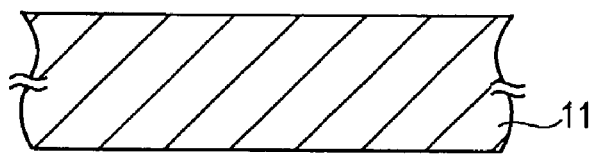
FIGS. 1A to 1D are cross sectional views of photovoltaic devices in each manufacturing process according to an embodiment of the present invention.

The single crystalline silicon substrate 11 is cleaned and put into a vacuum chamber to be heated at temperatures up to 200° C., whereby the moisture on the substrate is almost removed. In this embodiment, the substrate is heated up to 170° C. Next, hydrogen gas (H$_2$) is introduced and the substrate is exposed to plasma discharge to clean the surface thereof. It is known that this process is effective to reduce the amount of carbon on a surface of a substrate. In this embodiment, carbon dioxide gas (CO$_2$) is introduced during the hydrogen plasma process to decompose the carbon dioxide gas and attach oxygen (O$_2$) onto the surface so that oxygen is introduced into an interface of the single crystalline silicon substrate (FIG. 1A). Table 1 shows conditions for this process. Although trace amounts of carbon are introduced together with oxygen, carbon rarely influences the junction characteristics because carbon is neutral in silicon.

Figure 1B:
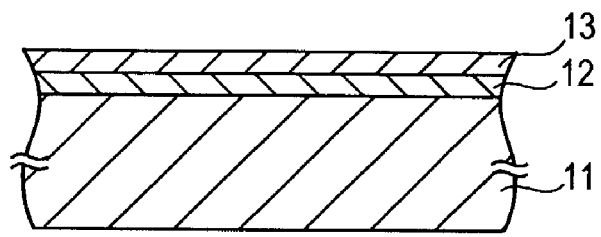

After that, silane gas (SiH$_4$) and diluting gas of hydrogen gas (H$_2$) are introduced and a non-doped i-type amorphous silicon layer 12 is formed by plasma CVD method while maintaining the substrate temperature 170° C. Then silane gas (SiH$_4$), diborane gas (B$_2$H$_6$) and hydrogen gas (H$_2$) are introduced and a p-type amorphous silicon layer 13 is formed sequentially by plasma CVD method to form a p-n junction (FIG. 1B). Table 1 shows conditions for this process.

Figure 1C:
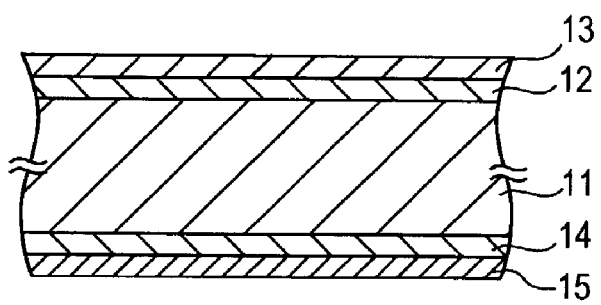

Next, an amorphous silicon thin film is formed on the rear surface of the n-type single crystalline silicon substrate 11 in the same manner. First, the n-type single crystalline silicon substrate 11 is put into a vacuum chamber to be heated at temperatures up to 200° C. In this embodiment, the substrate is heated up to 170° C. Second, hydrogen gas ($H_2$) is introduced to generate plasma discharge. When necessary, carbon dioxide gas ($CO_2$) is introduced during the hydrogen plasma process. The introduction of oxygen to the interface follows the introduction of carbon dioxide gas ($CO_2$). After that, silane gas ($SiH_4$) and diluting gas of hydrogen gas ($H_2$) are introduced and a non-doped i-type amorphous silicon layer 14 is formed by plasma CVD method while maintaining the substrate temperature 170° C. Then silane gas ($SiH_4$), phosphine gas ($PH_3$) as dopant gas and hydrogen gas ($H_2$) are introduced and an n-type amorphous silicon layer 15 is formed sequentially by plasma CVD method to form a BSF (Back Surface Field) formation on the rear surface of the n-type single crystalline silicon substrate 11 (FIG. 1C). Table 1 shows conditions for this process.

Figure 1D:
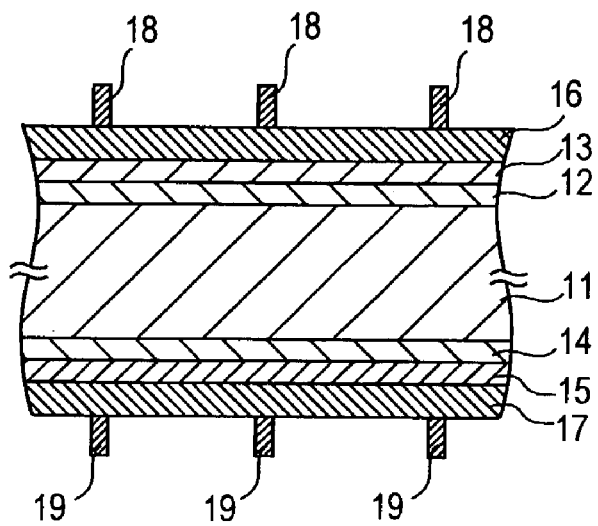

An indium tin oxide (ITO) layer 16 is formed by sputtering as a front surface side electrode and silver electrodes 18 are formed by screen-printing method as collector electrodes. Also, an ITO layer 17 is formed by sputtering as a rear surface side electrode, and silver electrodes 19 are formed by screen-printing method as collector electrodes, which completes the photovoltaic device (FIG. 1D).

Detailed conditions for forming the above-mentioned photovoltaic device are shown in Table 1.

TABLE 1

| | conditions | | | |
|---|---|---|---|---|
| Process | substrate temperature (° C.) | used gas | pressure (Pa) | power density (mW/cm$^2$) |
| front surface side | | | | |
| hydrogen process | 170 | $H_2$: 100 sccm $CO_2$: 0–100 sccm | 70 | 8.33 |
| i-type a-Si | 170 | $SiH_4$: 40 sccm | 40 | 8.33 |
| p-type a-Si | 170 | $H_2$: 0–100 sccm $SiH_4$: 40 sccm $B_2H_6$(2%): 40 sccm | 40 | 8.33 |
| rear surface side | | | | |
| hydrogen process | 170 | $H_2$: 100 sccm $CO_2$: 0–100 sccm | 70 | 8.33 |
| i-type a-Si | 170 | $SiH_4$: 40 sccm | 40 | 8.33 |
| n-type a-Si | 170 | $H_2$: 0–100 sccm $SiH_4$: 40 sccm $PH_3$(1%): 40 sccm | 40 | 8.33 |

Figure 2:
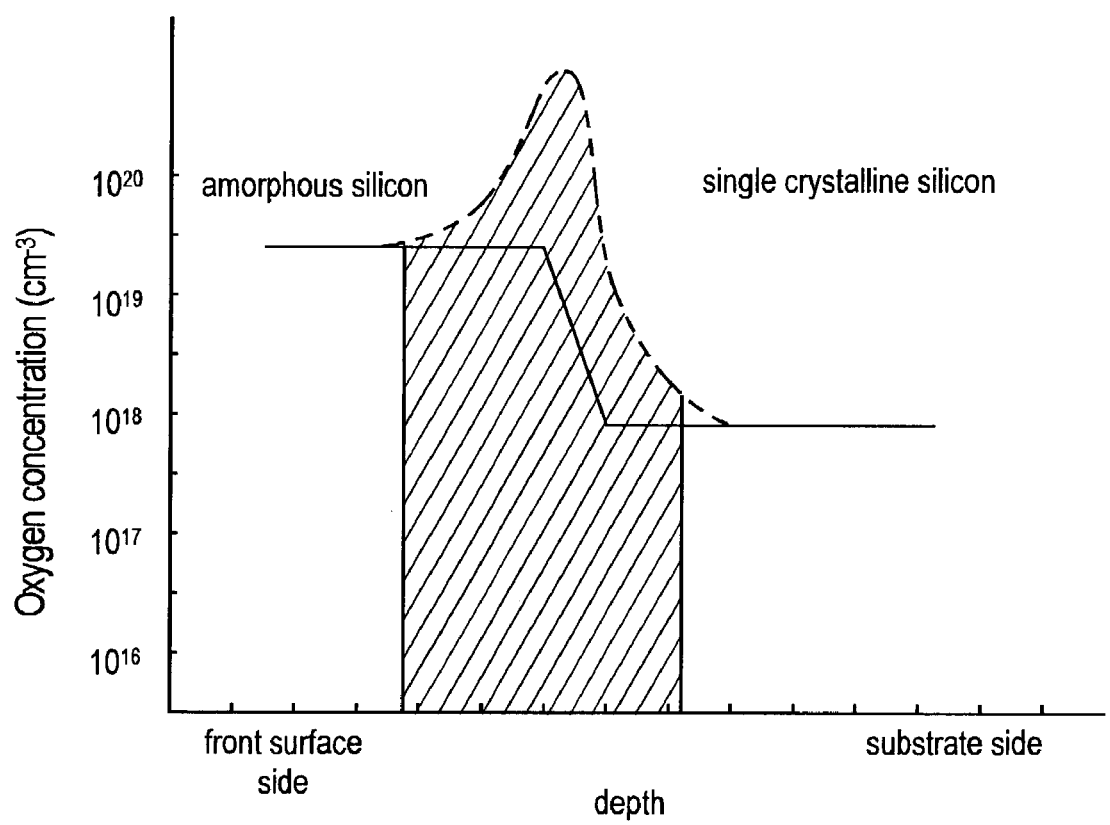
FIG. 2 is a plot showing characteristics of a volume concentration of oxygen measured by SIMS analysis.

Table 2 is a result of measuring output characteristics when the surface density of oxygen atoms at the interface varies by changing a gas flow of carbon dioxide ($CO_2$) gas in a range between 0 and 100 sccm (standard cube centimeter) in the hydrogen plasma process for the front surface of the single crystalline silicon substrate 11. As shown in FIG. 2, the surface density of oxygen atoms at the interface is obtained by SIMS (secondary ion mass spectroscopy) analysis as follows: measuring a concentration in the depth direction from the amorphous silicon layer 12 side; integrating the measured concentration with respect to the depth direction to obtain a volume concentration of oxygen (O); obtaining the volume concentration of an area with stripe lines in FIG. 2, in other words, obtaining the volume concentration of an area around the interface in the depth direction (20–30 Å)—from a point reaching background level of an oxygen concentration in the substrate or from a point reaching background level of the oxygen concentration in the amorphous silicon layer; and calculating the surface density of atoms at the interface.

FIG. 2 indicates that the volume concentration of oxygen in the amorphous silicon layer is higher than that in the single crystalline silicon substrate. Also the volume concentration of oxygen in the amorphous silicon layer is not higher than $2 \times 10^{22}$ cm$^{-3}$.

TABLE 2

| | B density (cm$^{-2}$) | O density (cm$^{-2}$) | Voc (V) | Isc (A) | F.F. | Pmax (W) |
|---|---|---|---|---|---|---|
| without $CO_2$ | $6.00 \times 10^{+12}$ | $4.3 \times 10^{+13}$ | 0.673 | 3.734 | 0.755 | 1.897 |
| with $CO_2$ (a) | $5.40 \times 10^{+12}$ | $2.8 \times 10^{+14}$ | 0.712 | 3.716 | 0.767 | 2.029 |
| with $CO_2$ (b) | $6.60 \times 10^{+12}$ | $1.7 \times 10^{+15}$ | 0.708 | 3.722 | 0.765 | 2.016 |
| with $CO_2$ (c) | $5.70 \times 10^{+12}$ | $8.3 \times 10^{+15}$ | 0.685 | 3.728 | 0.758 | 1.936 |
| with $CO_2$ (d) | $5.80 \times 10^{+12}$ | $7.6 \times 10^{+16}$ | 0.671 | 3.691 | 0.743 | 1.840 |

As can be seen in Table 2, open circuit voltage (Voc) and fill factor (F.F.) are improved according to the embodiment introducing $CO_2$ gas in the plasma process for the front surface of the single crystalline silicon substrate 11 in comparison with a comparative example without introducing $CO_2$ gas.

Figure 3:
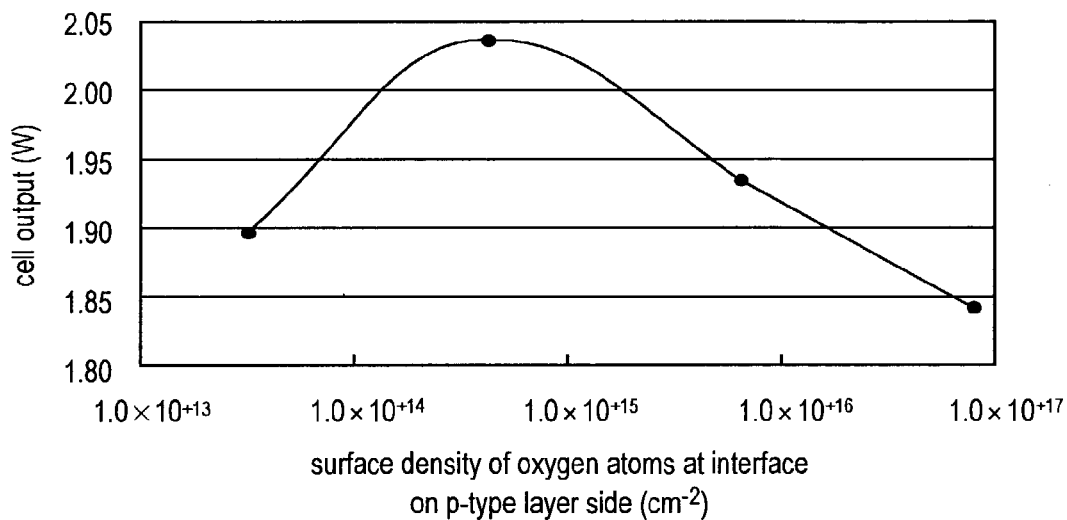
FIG. 3 is a plot showing characteristics of a relationship between cell output (Pmax) of the photovoltaic device and a surface density of oxygen atoms at the interface on the front surface side.

FIG. 3 shows a relationship between cell output (Pmax) of the photovoltaic device wherein $CO_2$ gas is introduced into the front surface side of the substrate in the plasma process and a surface density of oxygen atoms at the interface on the front surface side.

It is apparent from FIG. 3 that excellent cell output of over 1.900 W can be realized when the surface density of oxygen atoms at the interface is in a range between $5 \times 10^{13}$ cm$^{-2}$ and $1 \times 10^{16}$ cm$^{-2}$. Therefore, the flow of $CO_2$ gas to be introduced during the plasma process for the front surface side of the single crystalline silicon substrate 11 should be so controlled that the surface density of oxygen atoms at the interface will be in a range between $5 \times 10^{13}$ cm$^{-2}$ and $1 \times 10^{16}$ cm$^{-2}$.

One of the reasons why the characteristics are improved by introducing oxygen atoms at the interface as described above is that a network formed by covalent bond of silicon atoms having a coordination number of four increases the flexibility of the network structure by lacing oxygen atoms having a coordination number of two. Therefore carrier recombination is suppressed because a defect density at the interface is reduced, thereby open circuit voltage (Voc) and fill factor (F.F.) are improved.

At the interface on the p-type amorphous silicon layer 13 side, impurity boron (B), which is introduced from walls of film forming chamber, carrier tray of the substrate and substrate mask, is compensated as forming the amorphous silicon film, thereby obtaining an excellent p-i-n junction. For example, Applied Physics Letters vol. 68, 1996 p1201 discloses that it is possible to compensate impurity boron by introducing oxygen of the concentration about 1000 times higher than that of boron into an amorphous silicon film containing boron of a certain concentration.

Table 3 is a result of measuring output characteristics when the surface density of oxygen atoms at the interface varies by changing a gas flow of carbon dioxide ($CO_2$) gas in a range between 0 and 100 sccm to be introduced in a hydrogen plasma process for the rear surface of the single crystalline silicon substrate 11. In this embodiment, carbon gas ($CO_2$) is not introduced in the plasma process with hydrogen gas for the front surface of the single crystalline silicon substrate 11. The surface density of oxygen atoms at the interface is obtained with the same measuring technique for the front surface.

TABLE 3

|  | O density ($cm^{-2}$) | Voc (V) | Isc (A) | F.F. | Pmax (W) |
|---|---|---|---|---|---|
| without $CO_2$ | $3.8 \times 10^{+13}$ | 0.673 | 3.734 | 0.755 | 1.897 |
| with $CO_2$ (A) | $1.9 \times 10^{+14}$ | 0.678 | 3.721 | 0.767 | 1.935 |
| with $CO_2$ (B) | $3.3 \times 10^{+15}$ | 0.685 | 3.738 | 0.758 | 1.941 |
| with $CO_2$ (C) | $2.8 \times 10^{+16}$ | 0.679 | 3.728 | 0.757 | 1.916 |
| with $CO_2$ (D) | $2.1 \times 10^{+17}$ | 0.671 | 3.706 | 0.754 | 1.875 |

As apparent from table 3, open circuit voltage (Voc) and fill factor (F.F.) of the embodiment of the present invention with the introduction of $CO_2$ gas are improved in comparison with the a comparative example without the introduction of $CO_2$ gas in a plasma process for the rear surface of the single crystalline silicon substrate 11. It can be considered that oxygen atoms are effective at loosening structure of the layer as with the case of the p-type layer on the front surface side.

Figure 4:
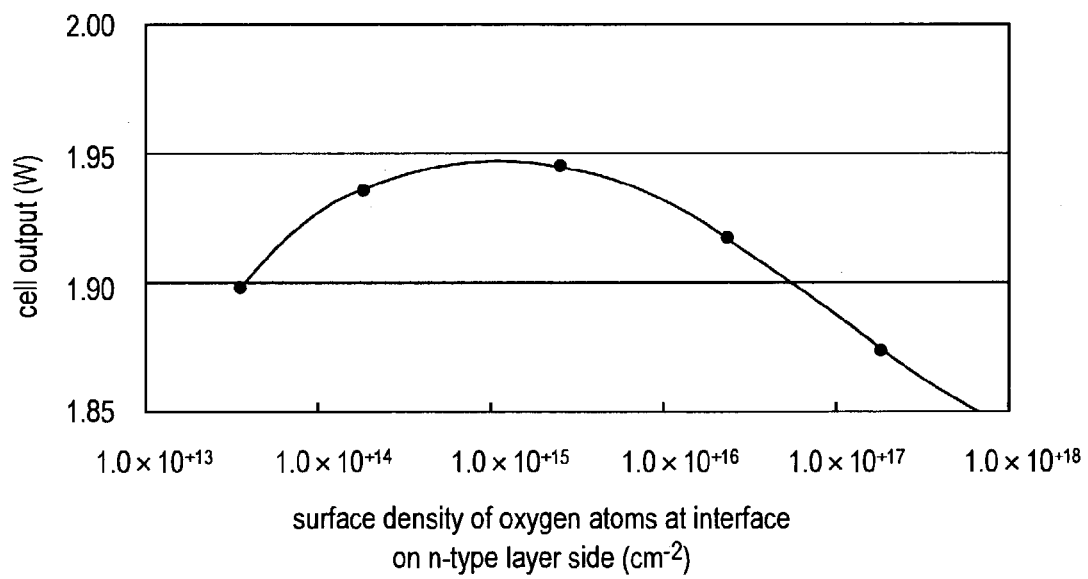
FIG. 4 is a plot showing characteristics of a relationship between cell output (Pmax) of the photovoltaic device and a surface density of oxygen atoms at the interface on the rear surface side.
Figure 5:
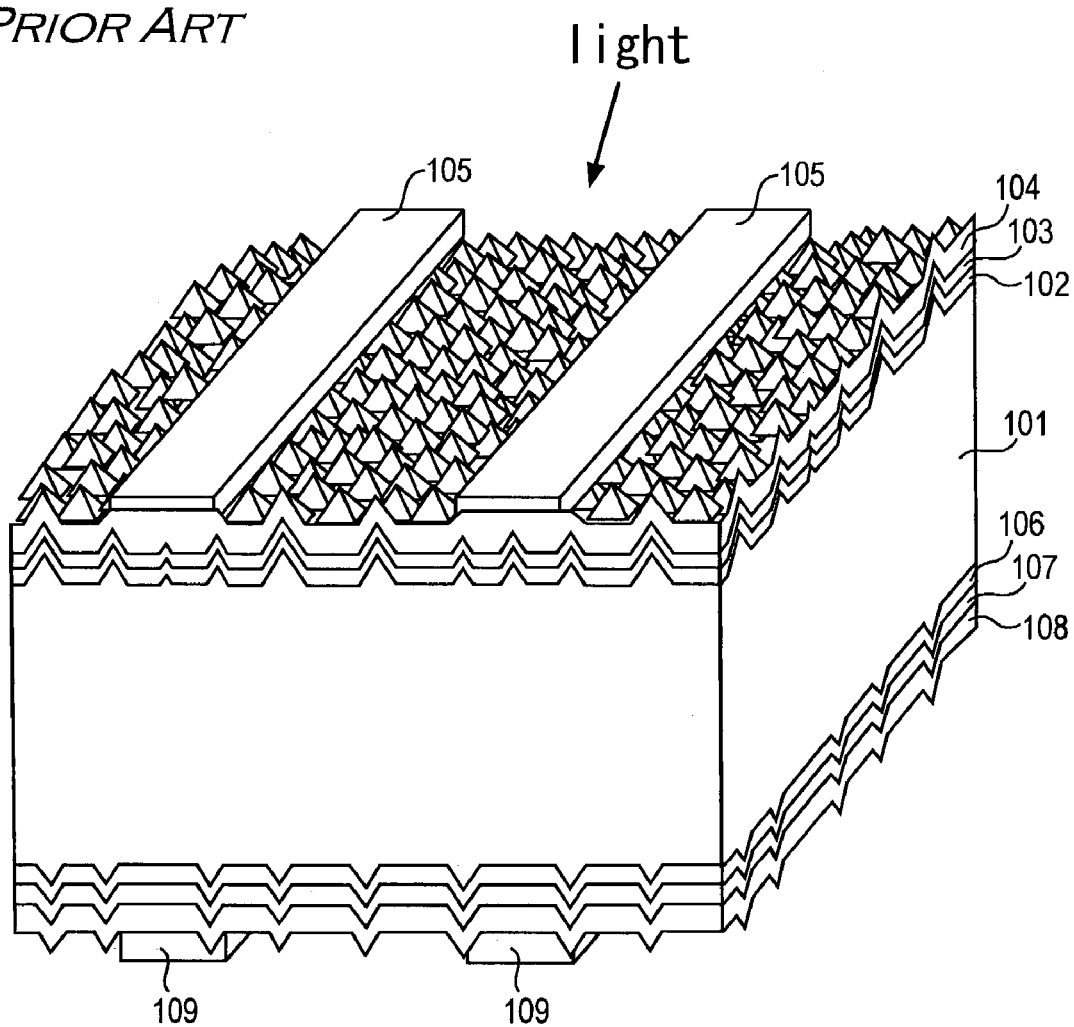
FIG. 5 is a perspective view of a photovoltaic device having a structure of which an i-type amorphous semiconductor layers is placed at each junction interface between an amorphous semiconductor and a crystalline semiconductor whose surfaces are textured.

FIG. 4 shows a relationship between cell output (Pmax) of the photovoltaic device wherein $CO_2$ gas is introduced into the rear surface in the plasma process and a surface density of oxygen atoms at the interface on the rear surface side.

It is apparent from FIG. 4 that excellent cell output of over 1.900 W can be realized when the surface density of oxygen atoms at the interface is in a range between $5 \times 10^{13}$ $cm^{-2}$ and $5 \times 10^{16}$ $cm^{-2}$. Therefore, the flow of $CO_2$ gas to be introduced during the hydrogen plasma process for the front surface side of the single crystalline silicon substrate 11 should be so controlled that the surface density of oxygen atoms at the interface will be in a range between $5 \times 10^{13}$ $cm^{-2}$ and $5 \times 10^{16}$ $cm^{-2}$.

Table 4 shows a relationship between output characteristics and the surface density of oxygen atoms at the interface of the front surface and the rear surface of the substrate, in other words at the interface on the p-type layer side and the n-type layer side.

TABLE 4

|  | Voc (V) | Isc (A) | F.F. | Pmax (W) |
|---|---|---|---|---|
| without $CO_2$ | 0.673 | 3.734 | 0.755 | 1.897 |
| with $CO_2$ on p side | 0.712 | 3.716 | 0.767 | 2.029 |
| with $CO_2$ on n side | 0.685 | 3.738 | 0.758 | 1.941 |
| with $CO_2$ on p and n sides | 0.715 | 3.738 | 0.765 | 2.045 |

Table 4 shows that the introduction of $CO_2$ gas to the interfaces on both the p and n sides improves open circuit voltage more than that of $CO_2$ gas to one interface in the hydrogen plasma process.

In a p-n junction formed from a crystalline silicon semiconductor and an amorphous silicon semiconductor, as described above, an appropriate amount of oxygen introduced in the vicinity of the interface between a substrate of crystalline silicon and an amorphous silicon semiconductor thin film can suppress recombination of carriers at the interface, thereby improving junction characteristics. Open circuit voltage of the photovoltaic device using this junction is improved. Effect of the present invention is proved.

Although the front amorphous silicon layer is first formed in this embodiment, the rear amorphous silicon layer may be formed before it. Also the n-type single crystalline substrate 11 of the embodiment has a BSF formation on its rear surface; however, similar effect can be obtained without the BSF formation.

Similar effect also can be obtained when using a p-type single crystalline substrate as a single crystalline substrate along with forming a non-doped amorphous silicon layer, an n-type amorphous silicon layer, an ITO layer and silver collector electrodes on the front surface side and forming a non-doped amorphous silicon layer, a p-type amorphous silicon layer and a rear surface electrode layer on the rear surface side of the substrate.

Although oxygen is used as atoms for reducing the average coordination number in the above embodiment, similar effect can be expected by using other atoms belonging to group 6B in the periodic table such as sulfur (S), selenium (Se) or tellurium (Te).

Although an amorphous silicon thin film is used as an amorphous semiconductor thin film in the above embodiment, a microcrystalline silicon thin film having minute crystal grains can be used in the same manner. Further similar effect can be expected when using germanium as semiconductors instead of silicon.

As described above, interface characteristics are improved by introducing atoms selectable among atoms belonging to group 6B in the periodic table such as oxygen atoms at an interface formed with a crystalline semiconductor and a substantially intrinsic amorphous semiconductor thin film, thereby improving solar cell property.

Although the present invention has been described and illustrated in detail, it should be clearly understood that the description discloses examples of different embodiments of the invention and is not intended to be limited to the examples or illustrations provided. Any changes or modifications within the spirit and scope of the present invention are intended to be included, the invention being limited only by the terms of the appended claims.

We claim:

1. A photovoltaic device comprising:
   a single crystal semiconductor with impurity doped to establish one conductivity type;
   a substantially intrinsic amorphous semiconductor thin film formed on and in contact with the single crystal semiconductor having one conductivity type; and
   an amorphous semiconductor thin film with impurity doped to establish the same or another conductivity type formed on the substantially intrinsic amorphous semiconductor thin film,
   wherein atoms, which reduce the average coordination number in the substantially intrinsic amorphous semiconductor thin film, exist in the interface formed between the single crystal semiconductor and the substantially intrinsic amorphous semiconductor thin film in a higher concentration than in a bulk, the interface being formed with the substantially intrinsic amorphous semiconductor thin film formed in contact with the single crystal semiconductor,
   wherein the single crystal semiconductor is a crystalline silicon and the amorphous semiconductor thin film is an amorphous silicon thin film, wherein atoms, which reduce the average coordination number, are oxygen atoms, and wherein a volume concentration of oxygen in the substantially intrinsic amorphous silicon semiconductor thin film is higher than that in the single crystal silicon semiconductor but not higher than $2\times10^{22}$ cm$^{-3}$, and a surface density of oxygen atoms at the interface is in a range between $5\times10^{13}$ cm$^{-2}$ and $1\times10^{16}$ cm$^{-2}$.

2. The photovoltaic device of claim 1 wherein:

the single crystal silicon semiconductor with impurity doped to establish one conductivity type is an n-type crystalline silicon semiconductor, and the amorphous silicon semiconductor thin film with impurity doped to establish another conductivity type is a p-type amorphous silicon semiconductor thin film.

* * * * *